(12) United States Patent
Chen et al.

(10) Patent No.: US 11,728,334 B2
(45) Date of Patent: Aug. 15, 2023

(54) THREE-DIMENSIONAL INTEGRATED CIRCUIT STRUCTURES AND METHOD OF FORMING THE SAME

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 231 days.

(21) Appl. No.: 16/106,011

(22) Filed: Aug. 21, 2018

(65) Prior Publication Data

US 2020/0006324 A1    Jan. 2, 2020

Related U.S. Application Data

(60) Provisional application No. 62/691,626, filed on Jun. 29, 2018.

(51) Int. Cl.
| | |
|---|---|
| H01L 27/06 | (2006.01) |
| H01L 23/00 | (2006.01) |
| H01L 23/48 | (2006.01) |
| H01L 25/07 | (2006.01) |

(52) U.S. Cl.
CPC ........ H01L 27/0688 (2013.01); H01L 23/481 (2013.01); H01L 24/09 (2013.01); H01L 25/072 (2013.01)

(58) Field of Classification Search
CPC ............... H01L 27/0688; H01L 23/481; H01L 25/0652; H01L 25/071
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2008/0224322 A1* | 9/2008 | Shinogi ............... H01L 22/10 257/777 |
| 2009/0085217 A1* | 4/2009 | Knickerbocker ....... H01L 25/50 257/E23.141 |
| 2011/0026232 A1* | 2/2011 | Lin .................... H01L 24/24 361/760 |

(Continued)

*Primary Examiner* — Matthew C Landau
*Assistant Examiner* — Mark Hatzilambrou
(74) *Attorney, Agent, or Firm* — JCIPRNET

(57) ABSTRACT

Three-dimensional integrated circuit structures are disclosed. A three-dimensional integrated circuit structure includes a first die, a second die and a device-free die. The first die includes a first device. The second die includes a second device and is bonded to the first die. The device-free die is located aside the second die and is bonded to the first die. The device-free die includes a conductive feature electrically connected to the first die and the second die.

20 Claims, 10 Drawing Sheets

(56) References Cited

U.S. PATENT DOCUMENTS

| | | | |
|---|---|---|---|
| 2012/0049320 A1* | 3/2012 | Parsey, Jr. | H01L 27/0207 |
| | | | 257/528 |
| 2015/0021785 A1* | 1/2015 | Lin | H01L 25/0657 |
| | | | 257/774 |
| 2016/0322330 A1* | 11/2016 | Lin | H01L 25/0652 |
| 2017/0092626 A1* | 3/2017 | Yuan | H01L 21/768 |
| 2018/0005940 A1* | 1/2018 | Chen | H01L 25/0657 |

\* cited by examiner

THREE-DIMENSIONAL INTEGRATED CIRCUIT STRUCTURES AND METHOD OF FORMING THE SAME

CROSS-REFERENCE TO RELATED APPLICATION

This application claims the priority benefits of U.S. provisional application Ser. No. 62/691,626, filed on Jun. 29, 2018. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

DETAILED DESCRIPTION

Figure 1:
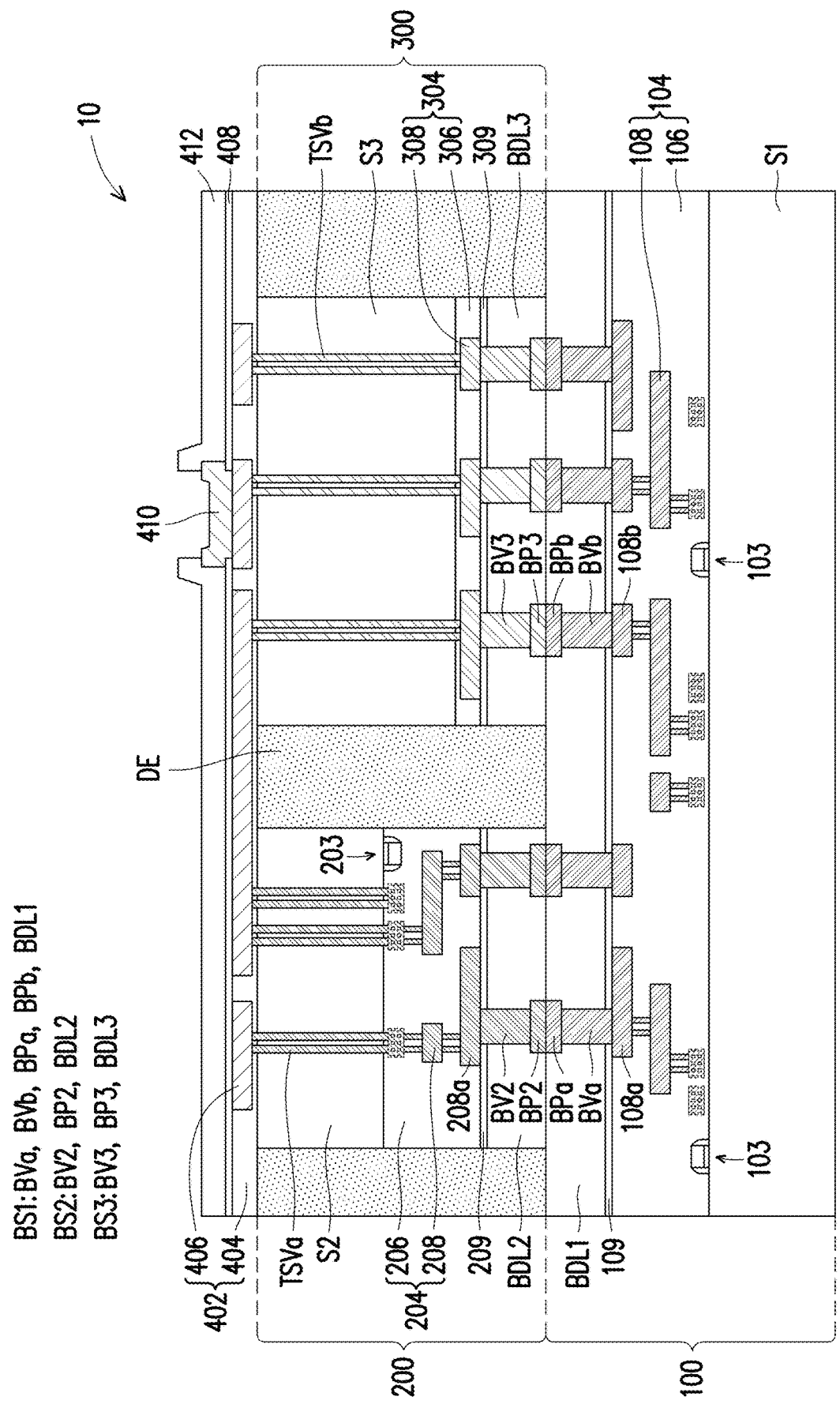
FIG. 1 is a cross-sectional view of a three-dimensional integrated circuit structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
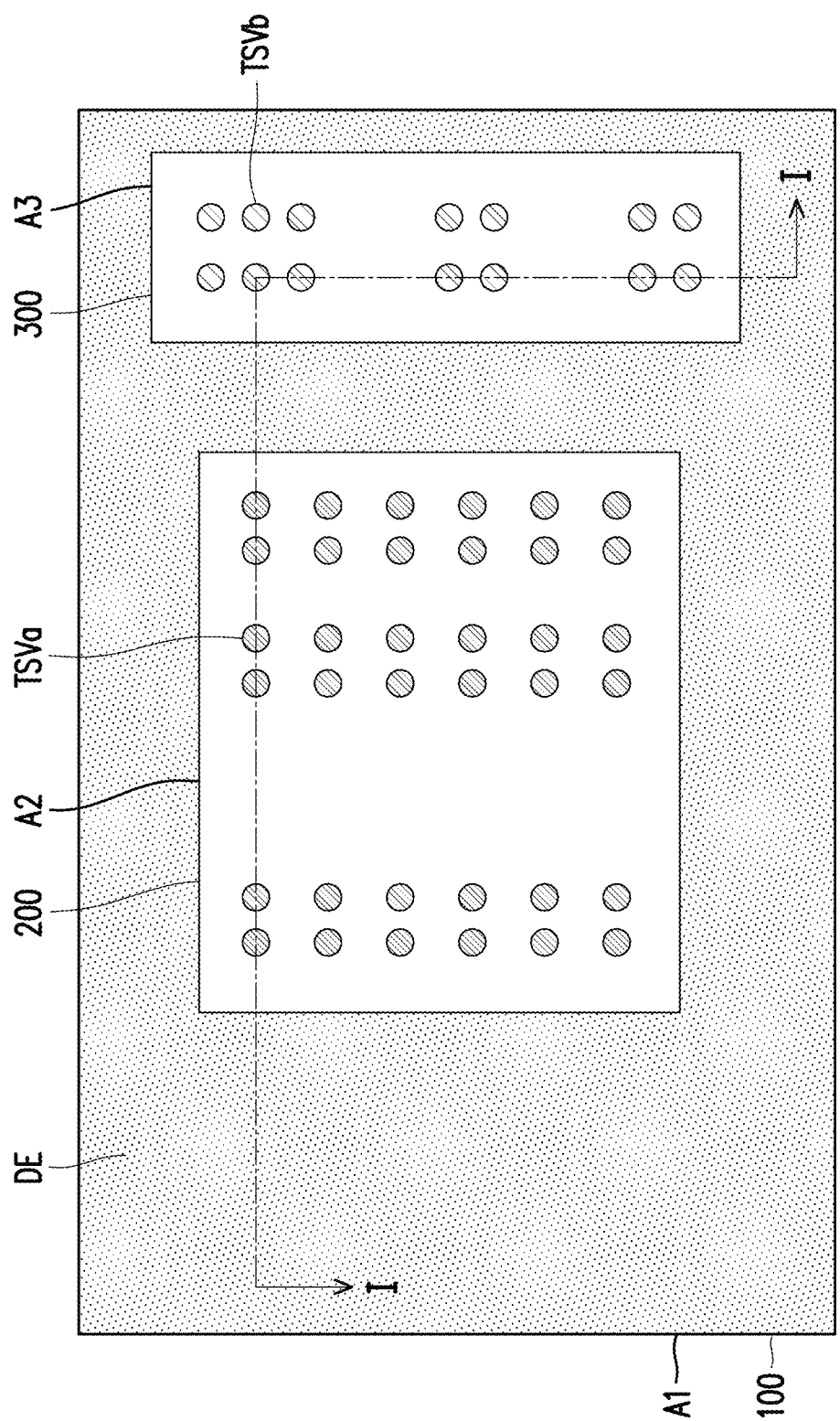
FIG. 2 is a simplified top view of a three-dimensional integrated circuit structure in accordance with some embodiments.

FIG. 1 is a cross-sectional view of a three-dimensional integrated circuit structure in accordance with some embodiments. FIG. 2 is a simplified top view of a three-dimensional integrated circuit structure in accordance with some embodiments. Specifically, FIG. 1 is a cross-sectional view taken along the line I-I of FIG. 2. For simplicity and clarity of illustration, only few elements such as first to third dies, through substrate vias and a dielectric encapsulation are shown in the simplified top view of FIG. 2, and these elements are not necessarily in the same plane. FIG. 3A to FIG. 3D are cross-sectional views of respective intermediate structures during an example method of forming a three-dimensional integrated circuit structure in accordance with some embodiments.

Figure 3A:
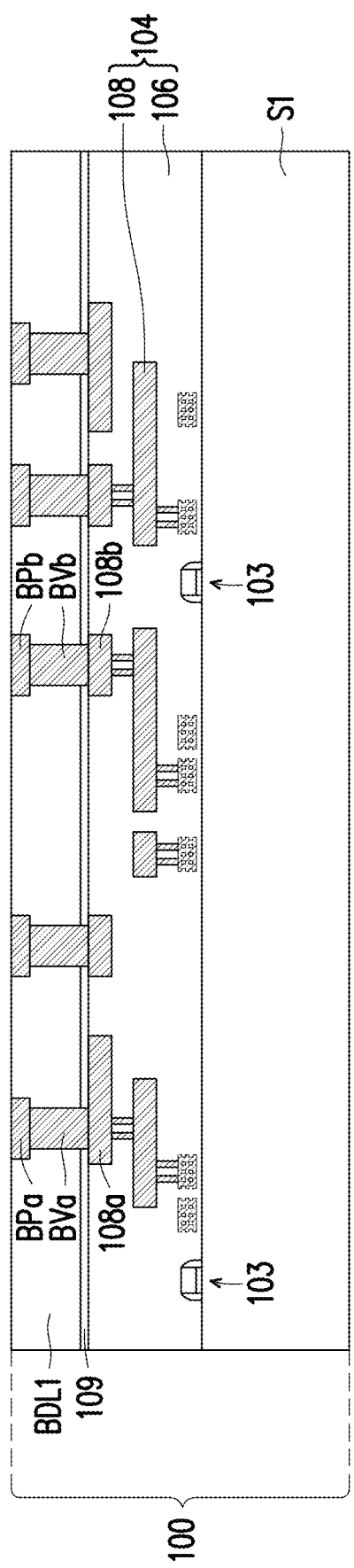
FIG. 3A to FIG. 3D are cross-sectional views of respective intermediate structures during an example method of forming a three-dimensional integrated circuit structure in accordance with some embodiments.

Referring to FIG. 1 and FIG. 3A, a first die 100 is provided. The first die 100 may be an application-specific integrated circuit (ASIC) chip, an analog chip, a sensor chip, a wireless and radio frequency chip, a voltage regulator chip or a memory chip, for example. In some embodiments, the first die 100 may include an active component or a passive component. In some embodiments, the first die 100 includes a first semiconductor substrate S1, a first interconnect structure 104 and a first bonding structure BS1.

The first semiconductor substrate S1 includes an elementary semiconductor such as silicon, germanium and/or a compound semiconductor such as silicon germanium, silicon carbide, gallium arsenic, indium arsenide, gallium nitride or indium phosphide. In some embodiments, the first semiconductor substrate S1 includes a silicon-containing material. For example, the first semiconductor substrate S1 is a silicon-on-insulator (SOI) substrate or a silicon substrate. In various embodiments, the first semiconductor substrate S1 may take the form of a planar substrate, a substrate with multiple fins, nanowires, or other forms known to people having ordinary skill in the art. Depending on the requirements of design, the first semiconductor substrate S1 may be a P-type substrate or an N-type substrate and may have doped regions therein. The doped regions may be configured for an N-type device or a P-type device. In some embodiments, the first semiconductor substrate S1 may have through substrate vias therein upon the process requirements.

The first semiconductor substrate S1 includes isolation structures defining at least one active area, and at least one first device 103 is disposed on/in the active area. The first device 103 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the first device 103 includes a gate dielectric layer, a gate electrode, source/drain regions, spacers, and the like. In some embodiments, the first die 100 is referred to as a "first device die" through the specification.

The first interconnect structure 104 is disposed over a first side (e.g., front side) of the first semiconductor substrate S1. Specifically, the first interconnect structure 104 is disposed over and electrically connected to the first device 103. In some embodiments, the first interconnect structure 104 includes at least one first insulating layer 106 and a plurality of first metal features 108. The first metal features 108 are disposed in the first insulating layer 106 and electrically connected with each other. A portion of the first metal features 108, such as first top metal features 108a and 108b, are exposed by the first insulating layer 106. In some embodiments, the first insulating layer 106 includes an inter-layer dielectric (ILD) layer on the first semiconductor substrate S1, and at least one inter-metal dielectric (IMD) layer over the inter-layer dielectric layer. In some embodiments, the first insulating layer 106 includes silicon oxide, silicon oxynitride, silicon nitride, a low dielectric constant (low-k) material or a combination thereof. The first insulating layer 106 may be a single layer or a multiple-layer structure. In some embodiments, the first metal features 108 include metal plugs and metal lines. The plugs may include contacts formed in the inter-layer dielectric layer, and vias formed in the inter-metal dielectric layer. The contacts are formed between and in contact with a bottom metal line and the underlying first device 103. The vias are formed between and in contact with two metal lines. The first metal features 108 may include tungsten (W), copper (Cu), a copper alloy, aluminum (Al), an aluminum alloy or a combination thereof. In some embodiments, a barrier layer may be disposed between each first metal feature 108 and the first insulating layer 106 to prevent the material of the first metal feature 108 from migrating to the underlying first device 103. The barrier layer includes Ta, TaN, Ti, TiN, CoW or a combination thereof, for example. In some embodiments, the first interconnect structure 104 is formed by a dual damascene process. In alternative embodiments, the first interconnect structure 104 is formed by multiple single damascene processes. In yet alternative embodiments, the first interconnect structure 104 is formed by an electroplating process.

In some embodiments, a first passivation layer 109 is optionally formed over the first interconnect structure 104. The first passivation layer 109 covers the first insulating material 106 and exposes portions of the first top metal features 108a and 108b. In some embodiments, the first passivation layer 109 includes silicon oxide, silicon nitride, benzocyclobutene (BCB) polymer, polyimide (PI), polybenzoxazole (PBO) or a combination thereof, and is formed by a suitable process such as spin coating, CVD or the like.

The first bonding structure BS1 is disposed over the first side (e.g., front side) of the first semiconductor substrate S1. Specifically, the first bonding structure BS1 is disposed over the first interconnect structure 104 or the first passivation layer 109. In some embodiments, the first bonding structure BS1 includes at least one first bonding dielectric layer BDL1 and a plurality of first bonding metal features. In some embodiments, the first bonding dielectric layer BDL1 includes silicon oxide, silicon nitride, a polymer or a combination thereof. The first bonding metal features are disposed in the first bonding dielectric layer BDL1 and electrically connected with each other. In some embodiments, the first bonding metal features include first bonding pads BPa and BPb and first bonding vias BVa and BVb. Specifically, as shown in FIG. 1, the first bonding pads BPa are electrically connected to the first bonding vias BVa and therefore the first top metal features 108a, and the first bonding pads BPb are electrically connected to the first bonding vias BVb and therefore the first top metal features 108b. The first bonding metal features may include tungsten (W), copper (Cu), a copper alloy, aluminum (Al), an aluminum alloy or a combination thereof. In some embodiments, a barrier layer may be disposed between each first bonding metal feature and the first bonding dielectric layer BDL1. The barrier layer includes Ta, TaN, Ti, TiN, CoW or a combination thereof, for example. In some embodiments, the first bonding structure BS1 is formed by a dual damascene process. In alternative embodiments, the first bonding structure BS1 is formed by multiple single damascene processes. In yet alternative embodiments, the first bonding structure BS1 is formed by an electroplating process.

Figure 3B:
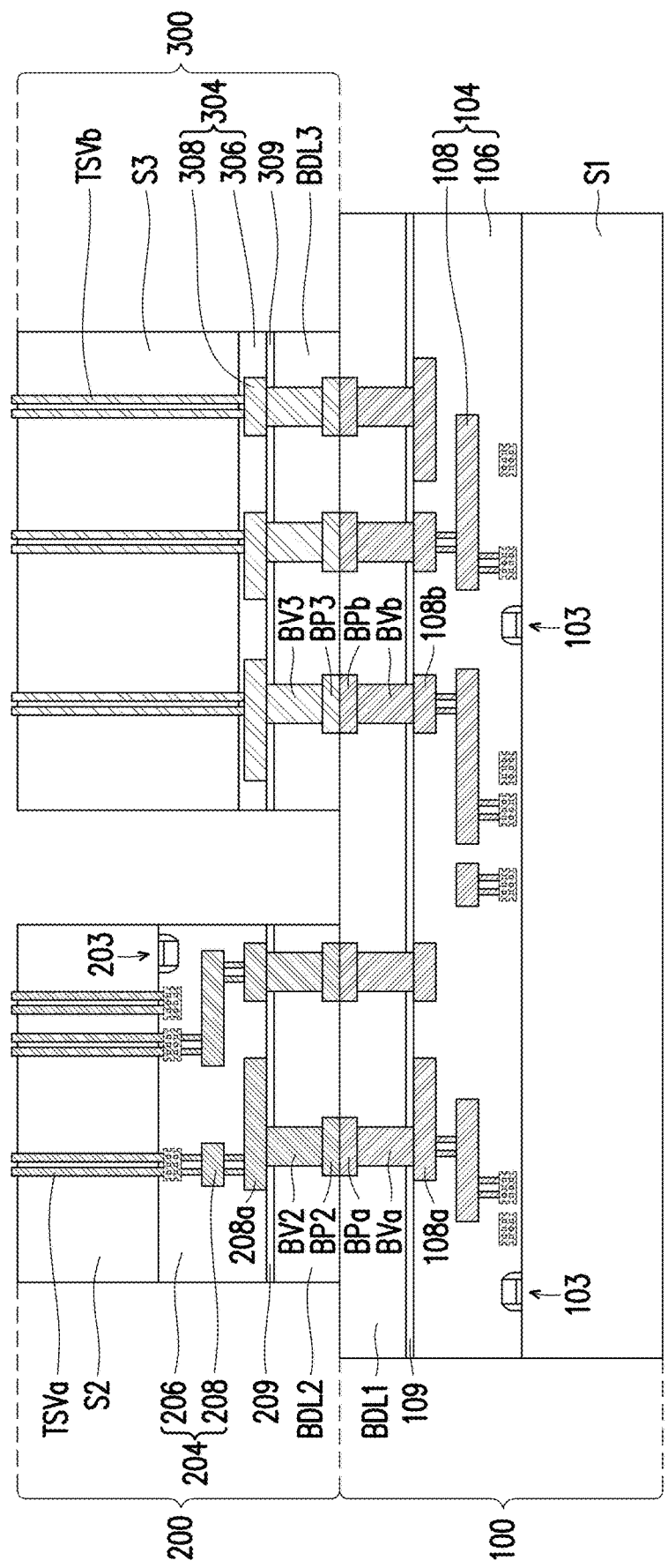

Referring to FIG. 1 and FIG. 3B, a second die 200 is provided. The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type or different types of dies. In some embodiments, the second die 200 may include an active component or a passive component.

The second die 200 may have a structure similar to that of the first die 100. In some embodiments, the second die 200 includes a second semiconductor substrate S2, a second interconnect structure 204 and a second bonding structure BS2. Thus, the difference between the second die 200 and the first die 100 is illustrated in details below and the similarity between them is not iterated herein.

The second semiconductor substrate S2 may be similar to the first semiconductor substrate S1 in terms of materials and configurations. In some embodiments, the second semiconductor substrate S2 includes isolation structures defining at least one active area, and at least one second device 203 is disposed on/in the active area. The second device 203 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the second device 203 includes a gate dielectric layer, a gate electrode, source/drain regions, spacers, and the like. In some embodiments, the second die 200 is referred to as a "second device die" through the specification.

In some embodiments, the second die 200 further includes through substrate vias TSVa that penetrate through the second semiconductor substrate S2. In some embodiments, the through substrate vias TSVa are called "through silicon vias" when the second semiconductor substrate S2 is a silicon-containing substrate. The through substrate vias TSVa are electrically connected to the second interconnect structure 204 and the to-be-formed redistribution layer structure 402 (shown in FIG. 3D). In some embodiments, the through substrate vias TSVa include conductive vias. The conductive vias include copper, a copper alloy, aluminum, an aluminum alloy or a combination thereof. In some embodiments, each through substrate via TSVa further includes a diffusion barrier layer between the conductive via and the second semiconductor substrate S2. The diffusion barrier layer includes Ta, TaN, Ti, TiN, CoW or a combination thereof.

The second interconnect structure 204 may have a structure similar to that of the first interconnect structure 104. In some embodiments, the second interconnect structure 204 is disposed over a first side (e.g., front side) of the second semiconductor substrate S2. Specifically, the second interconnect structure 204 is disposed over and electrically connected to the second device 203. In some embodiments, the second interconnect structure 204 includes at least one second insulating layer 206 and a plurality of second metal features 208. In some embodiments, the second metal features 208 include metal plugs and metal lines. The second metal features 208 are disposed in the second insulating layer 206 and electrically connected with each other. A portion of the second metal features 208, such as second top metal features 208a, are exposed by the second insulating layer 206.

The second passivation layer 209 may be similar to the first passivation layer 109 in terms of materials and configurations. In some embodiments, a second passivation layer 209 is optionally formed over the second interconnect structure 204. The second passivation layer 209 covers the second insulating material 206 and exposes portions of the second top metal features 208a.

The second bonding structure BS2 may have a structure similar to that of the first bonding structure BS1. In some embodiments, the second bonding structure BS2 is disposed over the first side (e.g., front side) of the second interconnect structure 204 or the second passivation layer 209. In some embodiments, the second bonding structure BS2 includes at least one second bonding dielectric layer BDL2 and a plurality of second bonding metal features. The second bonding metal features are disposed in the second bonding dielectric layer BDL2 and electrically connected with each other. In some embodiments, the second bonding metal features include second bonding vias BV2 electrically connected to the second top metal features 208a of the second interconnect structure 204 and second bonding pads BP2 electrically connected to the second bonding vias BV2.

One difference between the second die 200 and the first die 100 lies in the die size. The size of the second die 200 is different from (e.g., less than) the size of the first die 100. Herein, the term "size" is referred to the length, width and/or area. For example, as shown in the top view of FIG. 2, the size or area of the second die 200 is less than the size or area of the first die 100.

Reference is made to FIG. 1 and FIG. 3B, where a third die 300 is provided. In some embodiments, the third die 300 is referred to as a "dummy die" through the specification. Herein, a dummy die indicates a non-operating die, a die configured for non-use, a die without devices therein or a die used only to electrically couple together two other dies in the die stack. In some embodiments, a dummy die is substantially free of any active devices or functional devices, such as transistors, capacitors, resistors, diodes, photodiodes, fuse devices and/or other similar devices. In some embodiments, a dummy die can be constructed without an active component, a passive component or both. In some embodiments, the third die 300 is called a "device-free die" or "dummy die" through the specification. However, a dummy die can include a conductive feature electrically connected to the adjacent die(s). In some embodiments, the conductive feature includes a through substrate via, a metal line, a metal plug, a metal pad or a combination thereof. Specifically, although the dummy die of the application does not include a device, it can function as an electrical connector between adjacent dies. In some embodiments, the dummy die of the application can be utilized to stiffen the package and protect the package against deformation. In some embodiments, the dummy die of the application can be configured to reduce coefficient of thermal expansion (CTE) mismatch and improve the warpage profile of the resulting package.

In some embodiments, the third die 300 includes a third semiconductor substrate S3, an optional third interconnect structure 304 and an optional third bonding structure BS3.

In some embodiments, the third semiconductor substrate S3 includes a silicon-containing material. For example, the third semiconductor substrate S3 is a silicon substrate. In some embodiments, the third semiconductor substrate S3 includes a material similar to that of the second semiconductor substrate S2 or the first semiconductor substrate S1, so as to mitigate CTE mismatch between the first die 100 and the second die 200. In some embodiments, the third semiconductor substrate S3 is substantially free of doped regions or isolation structures.

In some embodiments, the third die 300 further includes through substrate vias TSVb that penetrate through the third semiconductor substrate S3. In some embodiments, the through substrate vias TSVb are called "through silicon vias" when the third semiconductor substrate S3 is a silicon-containing substrate. The through substrate vias TSVb are electrically connected to the third interconnect structure 304 and the to-be-formed redistribution layer structure 402 (shown in FIG. 3D). In some embodiments, the through substrate vias TSVb include conductive vias. The conductive vias include copper, a copper alloy, aluminum, an aluminum alloy or a combination thereof. In some embodiments, each through substrate via TSVb further includes a diffusion barrier layer between the conductive via and the third semiconductor substrate S3. The diffusion barrier layer includes Ta, TaN, Ti, TiN, CoW or a combination thereof.

The third interconnect structure 304 is disposed over a first side (e.g., front side) of the third semiconductor substrate S3. In some embodiments, the third interconnect structure 304 includes at least one third insulating layer 306 and a plurality of third metal features 308. The third metal features 308 are disposed in the third insulating layer 306 and electrically connected with each other. The third metal features 308 include metal lines and/or metal plugs. In some embodiments, the third metal features 308 merely include top metal lines for simplifying the process operations.

In some embodiments, a third passivation layer 309 is optionally formed over the third interconnect structure 304. The third passivation layer 309 covers the third insulating material 306 and exposes portions of the third metal features 308.

The third bonding structure BS3 is disposed over the first side (e.g., front side) of the third interconnect structure 304 or the third passivation layer 309. In some embodiments, the third bonding structure BS3 includes at least one third bonding dielectric layer BDL3 and a plurality of third bonding metal features. The third bonding metal features are disposed in the third bonding dielectric layer BDL3 and electrically connected with each other. In some embodiments, the third bonding metal features include third bonding vias BV3 electrically connected to the third interconnect structure 304 and third bonding pads BP3 electrically connected to the third bonding vias BV3.

One difference between the third die 300 and the first die 100 lies in the die size. The size of the third die 300 is different from (e.g., less than) the size of the first die 100. Herein, the term "size" is referred to the length, width and/or area. For example, as shown in the top view of FIG. 2, the size or area of the third die 300 is less than the size or area of the first die 100.

Another difference between the third die 300 and the first die 100 lies in the die function. The third die 300 is a device-free die, while the first die 100 is a device-containing die.

Still referring to FIG. 1 and FIG. 3B, the second die 200 and the third die 300 are turned upside down and mounted onto the first die 100. In some embodiments, the second die 200 is placed over the first die 100 after the third die 300 is placed over the first die 100. In alternative embodiments, the second die 200 is placed over the first die 100 before the third die 300 is placed over the first die 100.

The second die 200 is electrically coupled to the first die 100. In some embodiments, the second die 200 and the first die 100 are face-to-face bonded together by the first bonding structure BS1 and the second bonding structure BS2. In some embodiments, before the second die 200 is bonded to the first die 100, the second bonding structure BS2 and the first bonding structure BS1 are aligned, such that the second bonding pads BP2 are bonded to the first bonding pads BPa and the second bonding dielectric layer BDL2 is bonded to the first bonding dielectric layer BDL1. In some embodiments, the alignment of the first bonding structure BS1 and the second bonding structure BS2 may be achieved by using an optical sensing method. After the alignment is achieved, the first bonding structure BS1 and the second bonding structure BS2 are bonded together by a hybrid bonding including a metal-to-metal bonding and a dielectric-to-dielectric bonding.

The third die 300 is electrically coupled to the first die 100. In some embodiments, the third die 300 and the first die 100 are face-to-face bonded together by the first bonding structure BS1 and the third bonding structure BS3. In some embodiments, before the third die 300 is bonded to the first die 100, the third bonding structure BS3 and the first bonding structure BS1 are aligned, such that the third bonding pads BP3 are bonded to the first bonding pads BPb and the third bonding dielectric layer BDL3 is bonded to the first bonding dielectric layer BDL1. In some embodiments, the alignment of the first bonding structure BS1 and the third bonding structure BS3 may be achieved by using an optical sensing method. After the alignment is achieved, the first bonding structure BS1 and the third bonding structure BS3 are bonded together by a hybrid bonding including a metal-to-metal bonding and a dielectric-to-dielectric bonding.

Figure 3C:
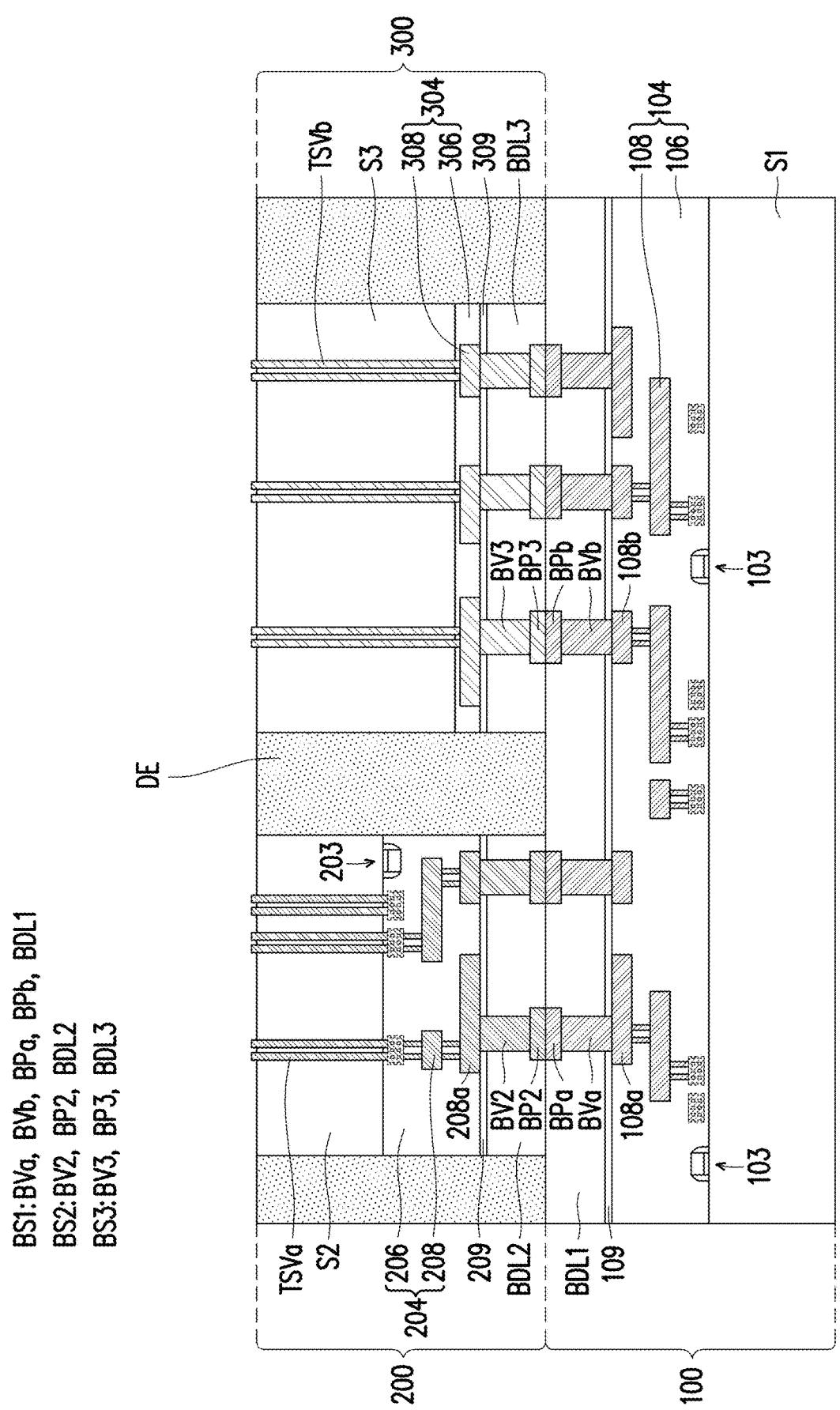

Referring to FIG. 1 and FIG. 3C, a dielectric encapsulation DE is formed over the first die 100 and around or aside the second die 200 and the third die 300. Specifically, the dielectric encapsulation DE surrounds the sidewalls of the second die 200 and the third die 300, exposes the tops of the second die 200 and the third die 300, and overlays the first side (e.g., front side) of the first die 100. In some embodiments, the second sides (e.g., back sides) of the second die 200 and the third die 300 are substantially coplanar with the top surface of the dielectric encapsulation DE. In some embodiments, the dielectric encapsulation DE includes a molding compound, a molding underfill, a resin or the like. In some embodiments, the dielectric encapsulation DE includes a polymer material such as polybenzoxazole (PBO), polyimide, benzocyclobutene (BCB), a combination thereof, or the like, and is formed by a molding process followed by a grinding process until surfaces of the second and third dies 200 and 300 are exposed. In alternative embodiments, the dielectric encapsulation DE includes silicon oxide, silicon nitride or a combination thereof, and is formed by spin-coating, lamination, deposition or the like, and followed by a grinding process or a planarization process.

Figure 3D:
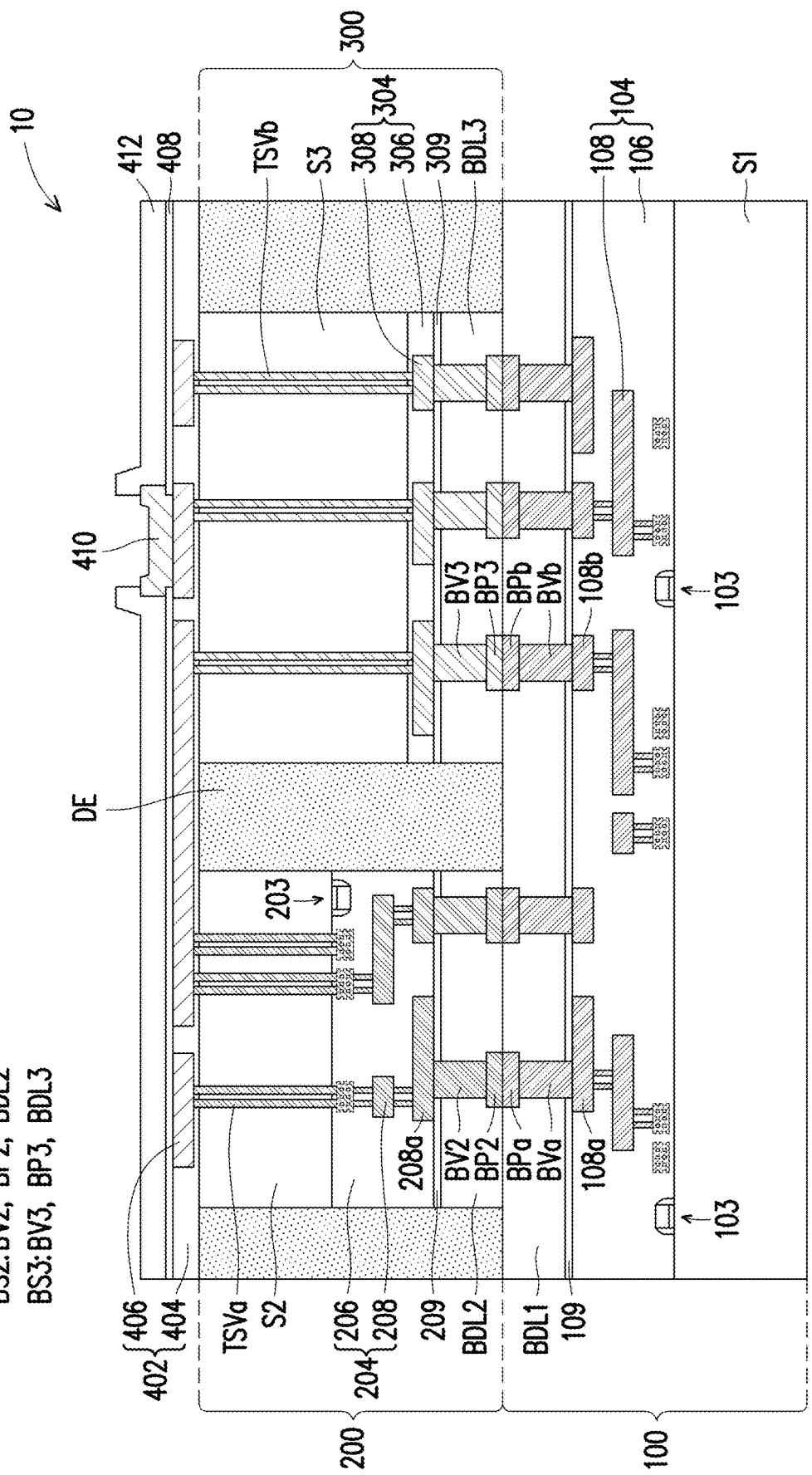

Referring to FIG. 1 and FIG. 3D, a redistribution layer structure 402 is formed over the second side (e.g., back side) of the second die 200, the second side (e.g., back side) of the third die 300, and the dielectric encapsulation DE. The redistribution layer structure 402 includes at least one dielectric layer 404 and at least one conductive layer 406 stacked alternately. In some embodiments, a portion of the redistribution layer structure 402 is electrically connected to the through substrate vias TSVa of the second die 200, and another portion of the redistribution layer structure 402 is electrically connected to the through substrate vias TSVb of the third die 300. In some embodiments, the dielectric layer 404 includes a photo-sensitive material such as polybenzoxazole (PBO), polyimide (PI), benzocyclobutene (BCB), a combination thereof or the like. In some embodiments, the conductive layer 406 includes copper, nickel, titanium, a combination thereof or the like. In some embodiments, a barrier layer may be disposed between the conductive layer 406 and the dielectric layer 404. The barrier layer includes Ta, TaN, Ti, TiN, CoW or a combination thereof, for example. In some embodiments, the redistribution layer structure 402 is formed by a dual damascene process. In alternative embodiments, the redistribution layer structure 402 is formed by multiple single damascene processes. In yet alternative embodiments, the redistribution layer structure 402 is formed by an electroplating process.

Thereafter, pads 410 are formed over the redistribution layer structure 402. In some embodiments, the pads 410 are under bump metallization (UBM) pads for mounting conductive connectors, such as metal pillars, μ-bumps or the like. The pads 410 include a metal or a metal alloy. The pads 410 include aluminum, copper, nickel, or an alloy thereof.

Afterwards, a passivation layer 412 covers the dielectric layer 404 and edge portions of the pads 410, and exposes the center portions of the pads 410. In some embodiments, another passivation layer 408 is optionally formed between the passivation layer 412 and the dielectric layer 404. In some embodiments, each of the passivation layer 408 and the passivation layer 412 includes silicon oxide, silicon nitride, benzocyclobutene (BCB) polymer, polyimide (PI), polybenzoxazole (PBO) or a combination thereof. In some embodiments, the passivation layer 408 includes a material different from that of the passivation layer 412. After the passivation layer 412 is formed, a three-dimensional integrated circuit structure 10 of the application is thus completed.

Figure 4:
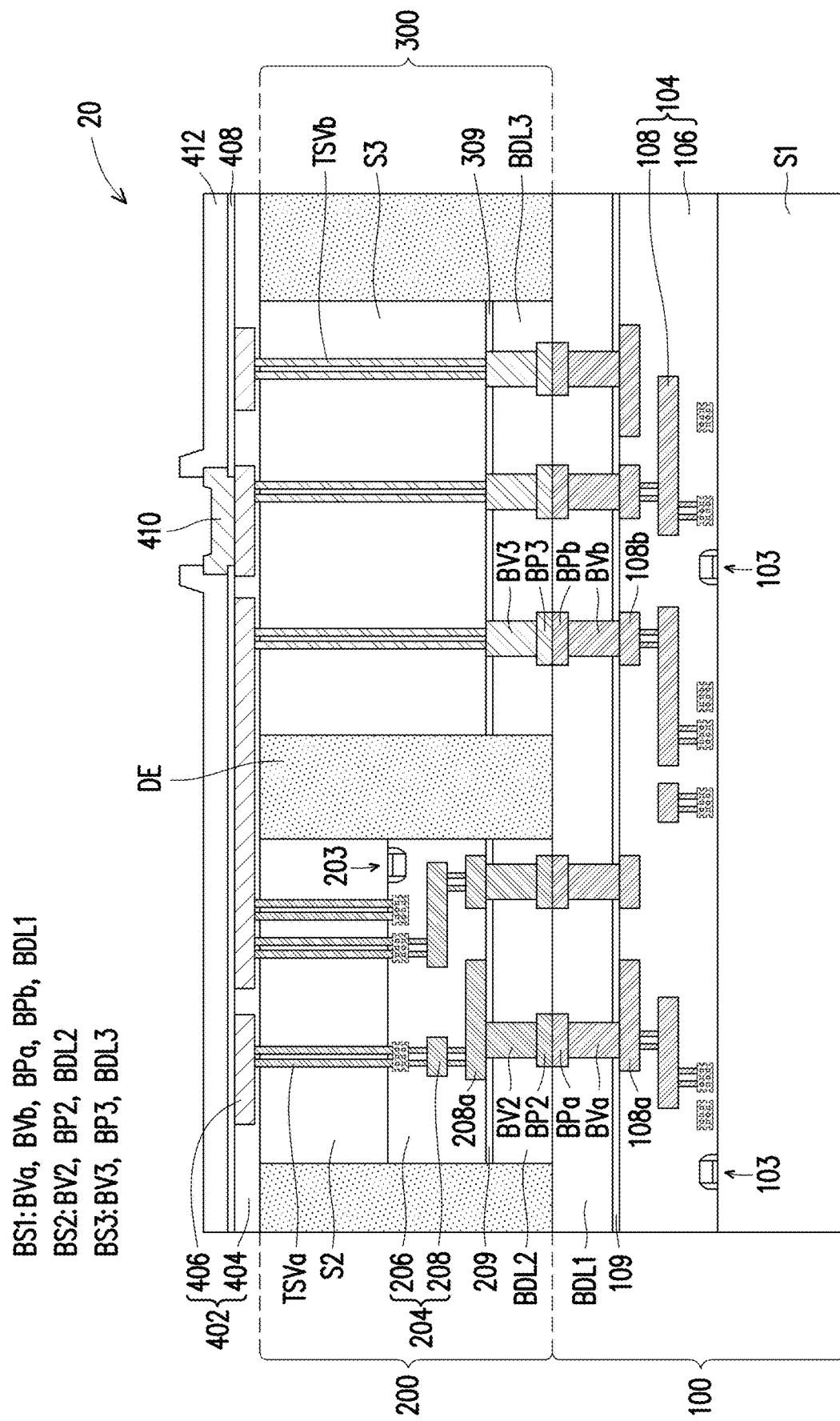
FIG. 4 to FIG. 5 are cross-sectional views of three-dimensional integrated circuit structures in accordance with alternative embodiments.

In some embodiments, a three-dimensional integrated circuit structure 20 is formed when the operation of forming the third interconnect structure 304 is omitted from the above method upon the process requirements, as shown in FIG. 4. Specifically, the through substrate vias TSVb of the third die 300 is directly bonded to the third bonding structure BS3 and therefore electrically coupled to the first bonding structure BS1 of the first die 100.

Figure 5:
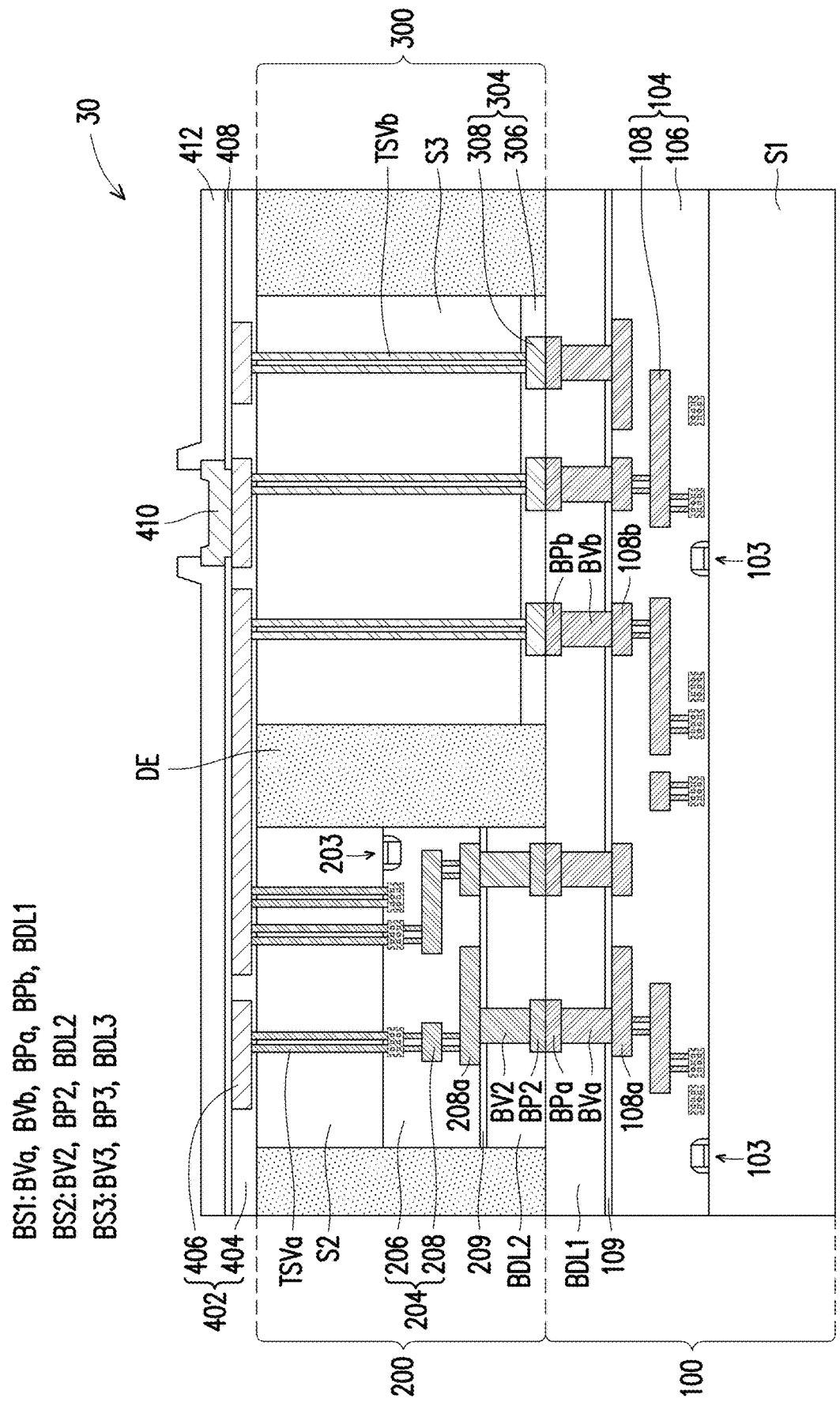

In some embodiments, a three-dimensional integrated circuit structure 30 is formed when the operation of forming the third bonding structure BS3 is omitted from the above method upon the process requirements, as shown in FIG. 5. Specifically, the third die 300 is bonded to the first die 100 through the third interconnect structure 304 and the first bonding structure BS1. Such bonding is a hybrid bonding including a metal-to-metal bonding and a dielectric-to-dielectric bonding.

Figure 6:
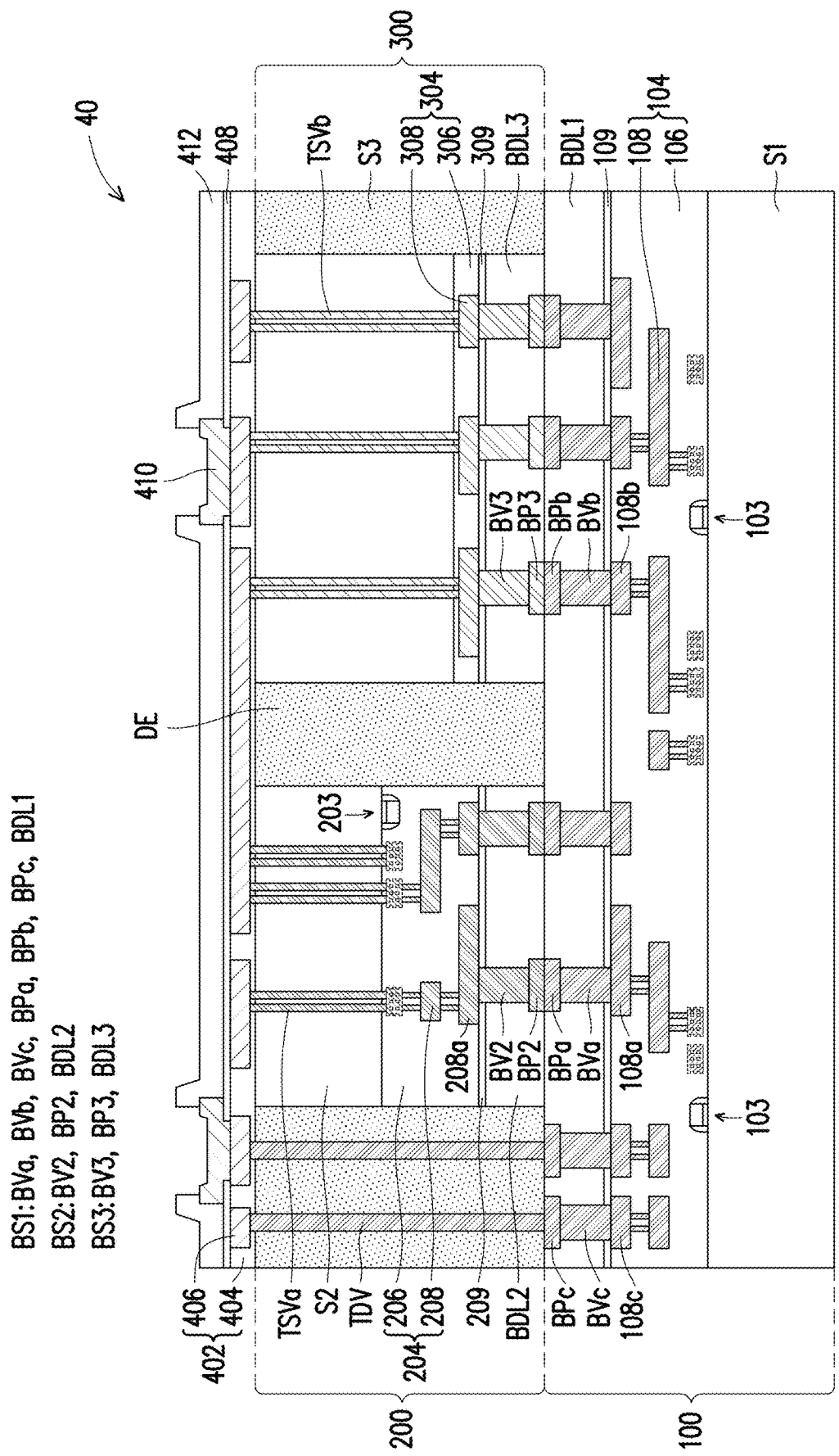
FIG. 6 is a cross-sectional view of a three-dimensional integrated circuit structure in accordance with yet alternative embodiments.

In some embodiments, a three-dimensional integrated circuit structure 40 is further formed when through dielectric vias TDV are formed after the dielectric encapsulation DE is formed over the first die 100 and around the second die 200 and the third die 300, as shown in FIG. 6. Specifically, the third die 300 with through substrate vias TSVb are located at one side of the second die 200, and the through dielectric vias TDV are located at the opposite side of the second die 200. In some embodiments, the through dielectric vias TDV are electrically connected to the first die 100 and the second die 200. Specifically, the first bonding structure BS1 further includes first bonding pads BPc and first bonding vias BVc at the outer side of the first bonding pads BPa and first bonding vias BVa, and the through dielectric vias TDV are electrically connected to the first bonding pads BPc of the first die 100. Besides, the through dielectric vias TDV are electrically connected to the redistribution layer structure 402 and therefore electrically connected to the second die 200.

In some embodiments, the through dielectric vias TDV include conductive vias. The conductive vias include copper, a copper alloy, aluminum, an aluminum alloy or a combination thereof. In some embodiments, each through dielectric via TDV further includes a diffusion barrier layer between the conductive via and the dielectric encapsulation DE. The diffusion barrier layer includes Ta, TaN, Ti, TiN, CoW or a combination thereof.

Some structures of the application are illustrated below with reference to the cross-sectional views of FIG. 1, FIG. 4, FIG. 5 and FIG. 6 as well as the top views of FIG. 2 and FIG. 7.

In some embodiments, as shown in FIG. 1 and FIG. 4-6, a three-dimensional integrated circuit structure 10/20/30/40 includes a first die 100, a second die 200 and a third die 300. The first die 100 includes a first device 103. The first die 100 is called a first device die in some examples. In some embodiments, the first die 100 includes a first semiconductor substrate S1, a first interconnect structure 104 over the first semiconductor substrate S1 and a first bonding structure BS1 over the first interconnect structure 104.

The second die 200 includes a second device 203. The second die 200 is called a second device die in some examples. In some embodiments, the second die 200 includes a second semiconductor substrate S2, a plurality of through substrate vias TSVa within the second semiconductor substrate S2, a second interconnect structure 204 over the second semiconductor substrate S2 and a second bonding structure BS2 over the second interconnect structure 204.

The second die 200 is bonded to the first die 100. In some embodiments, the second die 200 is directly bonded to the first die 100 through a hybrid bonding including a metal-to-metal bonding and a dielectric-to-dielectric bonding. Specifically, the second die 200 is bonded to the first die 100 with the second bonding structure BS2 and the first bonding structure BS1.

The third die 300 is substantially free of any active devices or functional devices. The third die 300 is called a device-free die or a dummy die in some examples. In some embodiments, the third die 300 includes a third semiconductor substrate S3, a plurality of through substrate vias TSVb within the third semiconductor substrate S3, an optional third interconnect structure 304 over the third semiconductor substrate S3 and an optional third bonding structure BS3 over the third interconnect structure 304.

The third die 300 is located aside the second die 200 and is bonded to the first die 100. In some embodiments, the third die 300 is directly bonded to the first die 100 through a hybrid bonding including a metal-to-metal bonding and a dielectric-to-dielectric bonding. In some embodiments, the third die 300 is bonded to the first die 100 with the third bonding structure BS3 and the first bonding structure BS1, as shown in FIG. 1, FIG. 4 and FIG. 6. In alternative embodiments, the third die 300 is bonded to the first die 100 with the third interconnect structure 304 and the first bonding structure BS1, as shown in FIG. 5.

In some embodiments, the three-dimensional integrated circuit structure 10/20/30/40 further includes a dielectric encapsulation DE over the first die 100 and around the second die 200 and the third die 300, as shown in FIG. 1 and FIG. 4-6.

In some embodiments, the three-dimensional integrated circuit structure 40 further includes a plurality of through dielectric vias TDV located aside the second die 200 and penetrating through the dielectric encapsulation DE, as shown in FIG. 6. In some embodiments, a dimension of the through dielectric vias TDV is different from a dimension of the through substrate vias TSVa or TSVb. Herein, the term "dimension" is referred to the height, length, width or a combination thereof. In some embodiments, the second semiconductor substrate S2 of the second die 200 is thinner than the third semiconductor substrate S3 of the third die 300, and the through substrate vias TSVa are shorter than the through substrate vias TSVb.

In some embodiments, the three-dimensional integrated circuit structure 10/20/30/40 further includes a redistribution layer structure 402 over the second die 200 and the third die 300 and electrically connected to the through substrate vias TSVa of the second die 200 and the through substrate vias TSVb of the third die 300.

In some embodiments, the second bonding structure BS2 and the third bonding structure BS3 are at substantially the same level. Herein, when elements are described as "at substantially the same level", the elements are formed at substantially the same height in the same layer, or having the same positions embedded by the same layer. In some embodiments, the elements at substantially the same level are formed from the same material(s) with the same process operation(s). In some embodiments, the tops of the elements at substantially the same level are substantially coplanar. For example, as shown in FIG. 1, FIG. 4 and FIG. 6, the top surface of the second bonding structure BS2 is substantially coplanar with the top surface of the third bonding structure BS3, and the bottom surface of the second bonding structure BS2 is substantially coplanar with the bottom surface of the third bonding structure BS3. By such disposition, the bonding strength between the first die 100 and the second die 200 is substantially the same as the bonding strength between the first die 100 and the third die 300, so the bonding uniformity is accordingly improved.

Figure 7:
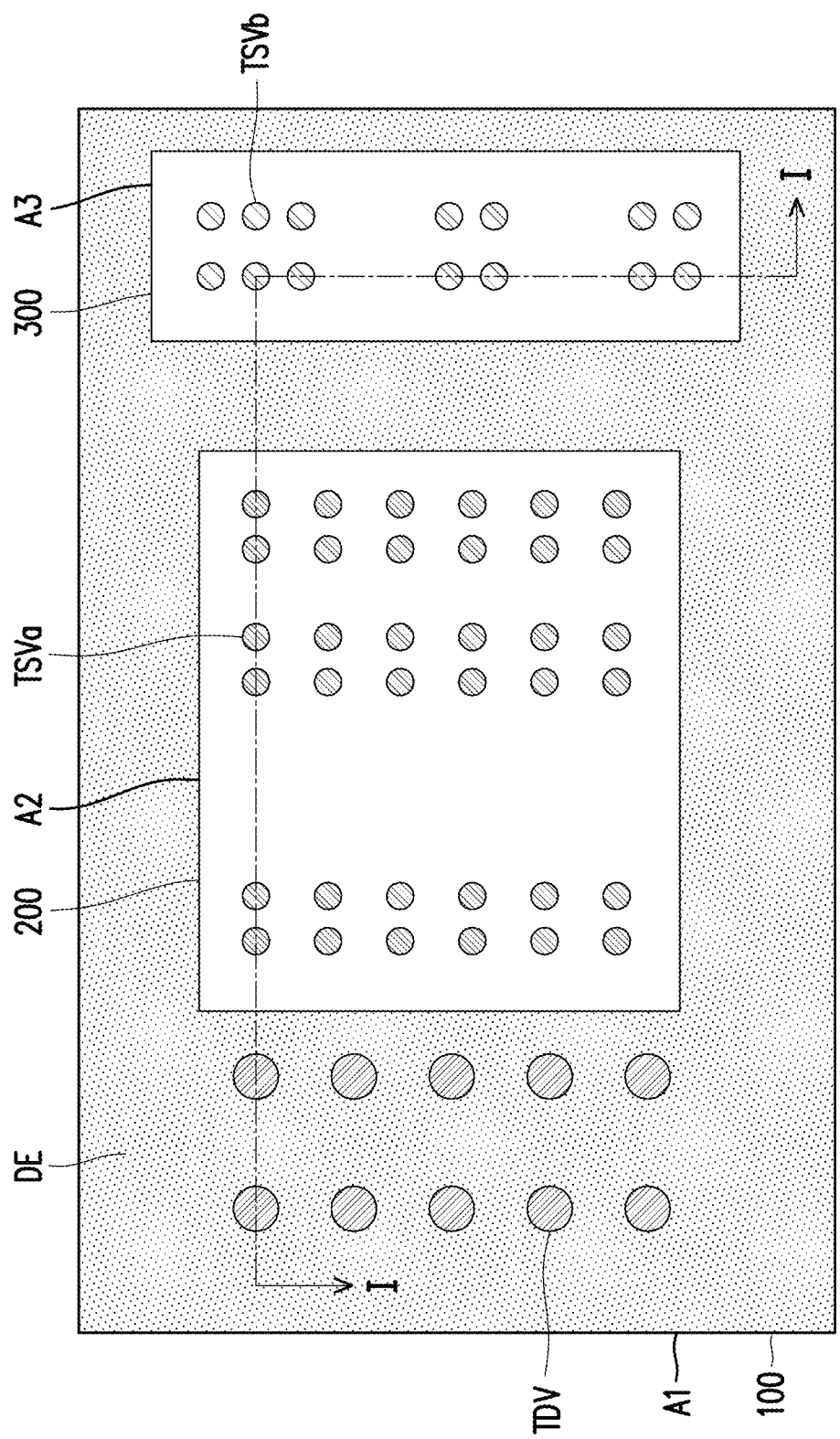
FIG. 7 is a simplified top view of a three-dimensional integrated circuit structure in accordance with yet alternative embodiments.

In some embodiments, as shown in FIG. 2 and FIG. 7, the first die 100 has a first top area A1, the second die 200 has a second top area A2, the third die 300 has a third top area A3, and a ratio of (A2+A3) to A1 is 0.4 or more. In some embodiments, the top area ratio of the second die 200 and the third die 300 to the first die 100 can be, for example but is not limited to, about 0.40, 0.45, 0.50, 0.55, 0.60, 0.65, 0.70, 0.75, 0.80, 0.85, 0.90, 0.95, including any range between any two of the preceding values and any range more than any one of the preceding values. In some embodiments, the top area ratio of the second die 200 and the third die 300 to the first die 100 is such as to reduce CTE mismatch and improve the warpage profile of the resulting package.

Specifically, the varying configurations of dies among different tiers may result in CTE mismatch. For example, the device die (e.g., the first die 100 or the second die 200) in each tier may have an effective CTE of around 3.0 due to the semiconductor material (e.g., silicon) present in such die. However, each tier may further include various other materials (e.g., a dielectric encapsulation DE and/or through dielectric vias TDV), which may have a higher effective CTE. In the application, the presence of the dummy die in the higher tier can reduce the overall effective CTE of the higher tier from that of the surrounding material (e.g., a dielectric encapsulation DE and/or through dielectric vias TDV) as a function of the total size/area of dies in each tier. For example, tiers having larger dies have a correspondingly lower effective CTE than tiers with smaller dies. In the application, the top area ratio of the second die 200 and the third die 300 in the higher tier to the first die 100 in the lower tier is designed to be about 0.4 or more, and such configuration can protect the package against deformation, reduce CTE mismatch and improve the warpage profile of the resulting package.

In view of the above, in a three-dimensional integrated circuit structure, by replacing at least a portion of the conventional through dielectric vias with the dummy die having through substrate vias, the CTE mismatch can be reduced and the package warpage can be prevented. Many variations of the above examples are contemplated by the present disclosure. It is understood that different embodiments may have different advantages, and that no particular advantage is necessarily required of all embodiments.

In accordance with some embodiments of the present disclosure, a three-dimensional integrated circuit structure includes a first die, a second die and a device-free die. The first die includes a first device. The second die includes a second device and is bonded to the first die. The device-free die is located aside the second die and is bonded to the first die. The device-free die includes a conductive feature electrically connected to the first die and the second die.

In accordance with alternative embodiments of the present disclosure, a method of forming a three-dimensional integrated circuit structure includes following operations. A first die is provided. A second die is bonded to the first die by a hybrid bonding including a metal-to-metal bonding and a dielectric-to-dielectric bonding. A dummy die having a plurality of through substrate vias is bonded to the first die by another hybrid bonding including a metal-to-metal bonding and a dielectric-to-dielectric bonding. A dielectric encapsulation is formed over the first die and around the second die and the dummy die. A redistribution layer structure is formed over the second die and the dummy die, and the redistribution layer structure is electrically connected to the through substrate vias of the dummy die.

In accordance with yet alternative embodiments of the present disclosure, a three-dimensional integrated circuit structure includes a first device die, a second device die and a dummy die. The first device die includes a first semiconductor substrate and a first bonding structure over the first semiconductor substrate. The second device die includes a second semiconductor substrate and a second bonding structure over the first semiconductor substrate, wherein the second device die is electrically coupled to the first device die by the second bonding structure and the first bonding structure. The dummy die includes a third semiconductor substrate, a plurality of first through vias within the third semiconductor substrate and a third bonding structure over the third semiconductor substrate and electrically connected to the plurality of first through vias, wherein the dummy die is electrically coupled to the first device die by the third bonding structure and the first bonding structure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated circuit structure, comprising:
a first die comprising a first device;
a second die comprising a second device and bonded to the first die; and
a device-free die located aside the second die and bonded to the first die, wherein the device-free die is electrically connected to the first die and the second die,
wherein the first die has first metal bonding features embedded in a first bonding dielectric layer, the device-free die has a second metal bonding feature embedded in a second bonding dielectric layer, the second metal bonding feature is connected to one of the first metal bonding features, and the second bonding dielectric layer is bonded to the first bonding dielectric layer, and
wherein from a top view, opposing edges of the device-free die are closer to opposing edges of the first die than are opposing edges of the second die, and an entire boundary of the device-free die and an entire boundary of the second die are both within a boundary of the first die.

2. The three-dimensional integrated circuit structure of claim 1, wherein the second metal bonding feature comprises a through substrate via, a metal line, a metal plug, a metal pad or a combination thereof.

3. The three-dimensional integrated circuit structure of claim 1, wherein a semiconductor substrate of the second die is thinner than a semiconductor substrate of the device-free die.

4. The three-dimensional integrated circuit structure of claim 1, wherein the first die has a first top area A1, the second die has a second top area A2, the device-free die has a third top area A3, and a ratio of (A2+A3) to A1 is 0.4 or more.

5. The three-dimensional integrated circuit structure of claim 1, wherein the second die has a third metal bonding feature embedded in a third bonding dielectric layer, the third metal bonding feature is connected to another of the first metal bonding features, and the third bonding dielectric layer is bonded to the first bonding dielectric layer.

6. The three-dimensional integrated circuit structure of claim 1, further comprising a dielectric encapsulation over the first die and around the second die and the device-free die.

7. The three-dimensional integrated circuit structure of claim 6, further comprising a plurality of through dielectric vias located aside the second die and penetrating through the dielectric encapsulation.

8. A three-dimensional integrated circuit structure, comprising:
   a first device die comprising a first semiconductor substrate and a first bonding structure;
   a second device die comprising a second semiconductor substrate and a second bonding structure, wherein the second device die is electrically coupled to the first device die by the second bonding structure and the first bonding structure; and
   a dummy die comprising a third semiconductor substrate, a plurality of first through vias within the third semiconductor substrate, and a third bonding structure electrically connected to the plurality of first through vias, wherein the dummy die is electrically coupled to the first device die by the third bonding structure and the first bonding structure,
   wherein the first bonding structure has first metal bonding features embedded in a first bonding dielectric layer, the third bonding structure of the dummy die has a second metal bonding feature embedded in a second bonding dielectric layer, the second metal bonding feature is connected to one of the first metal bonding features, and the second bonding dielectric layer is bonded to the first bonding dielectric layer, and
   wherein the second device die further comprises a second interconnect structure between the second semiconductor substrate and the second bonding structure, the dummy die further comprises a third interconnect structure between the third semiconductor substrate and the third bonding structure, and the third interconnect structure is thinner than the second interconnect structure,
   wherein from a top view, opposing edges of the dummy die are closer to opposing edges of the first device die than are opposing edges of the second device die, and an entire boundary of the dummy die and an entire boundary of the second device die are both within a boundary of the first device die, and
   wherein through dielectric vias are located aside the second device die and bonded to some of the first metal bonding features, wherein a height of the through dielectric vias is substantially the same as a height of each of the second device die and the dummy die.

9. The three-dimensional integrated circuit structure of claim 8, further comprising a redistribution layer structure over the second device die and the dummy die and electrically to a plurality of second through vias of the second device die and the plurality of first through vias of the dummy die.

10. The three-dimensional integrated circuit structure of claim 8, wherein a dimension of the through dielectric vias is different from a dimension of the first through vias.

11. The three-dimensional integrated circuit structure of claim 8, wherein the second semiconductor substrate is thinner than the third semiconductor substrate.

12. The three-dimensional integrated circuit structure of claim 8, wherein the second bonding structure and the third bonding structure are at substantially a same level.

13. The three-dimensional integrated circuit structure of claim 8, wherein a first bonding pad of the first bonding structure is bonded to a second bonding pad of the second bonding structure, and a first bonding dielectric layer of the first bonding structure is bonded to a second bonding dielectric layer of the second bonding structure.

14. The three-dimensional integrated circuit structure of claim 8, wherein at least two of the plurality of first through vias are landed on a same metal feature between the third semiconductor substrate and the third bonding structure.

15. A three-dimensional integrated circuit structure, comprising:
   a first die comprising a first device;
   a second die comprising a second device and bonded to the first die; and
   a device-free die located aside the second die and bonded to the first die, wherein the device-free die is electrically connected to the first die and the second die,
   wherein the first die has first metal bonding features embedded in a first bonding dielectric layer, the device-free die has second metal bonding features embedded in a second bonding dielectric layer, the second metal bonding features are connected to some of the first metal bonding features, and the second bonding dielectric layer is bonded to the first bonding dielectric layer,
   wherein from a top view, opposing edges of the device-free die are closer to opposing edges of the first die than are opposing edges of the second die, and an entire boundary of the device-free die and an entire boundary of the second die are both within a boundary of the first die, and
   wherein through dielectric vias are located aside the second die and bonded to some of the first metal bonding features, wherein a height of the through dielectric vias is substantially the same as a height of each of the second die and the device-free die.

16. The three-dimensional integrated circuit structure of claim 15, wherein a substrate of the device-free die is thicker than a substrate of the first die, and wherein the second die has third metal bonding features embedded in a third bonding dielectric layer, the third metal bonding features are connected to some of the first metal bonding features, and the third bonding dielectric layer is bonded to the first bonding dielectric layer, and a number of the second metal bonding features of the device-free die is greater than a number of the third metal bonding features of the second die.

17. The three-dimensional integrated circuit structure of claim 15, wherein the first die has a first top area A1, the second die has a second top area A2, the device-free die has a third top area A3, and a ratio of (A2+A3) to A1 is 0.4 or more.

18. The three-dimensional integrated circuit structure of claim 15, wherein the device free die further has through substrate vias.

19. The three-dimensional integrated circuit structure of claim 18, wherein the device-free die further has an interconnect structure between the through substrate vias and the first die.

20. The three-dimensional integrated circuit structure of claim 18, wherein a dimension of the through dielectric vias is different from a dimension of the through substrate vias.

* * * * *